United States Patent [19]

Takashima

[11] Patent Number: 5,341,509
[45] Date of Patent: * Aug. 23, 1994

[54] PARALLEL PROCESSING SYSTEM INCLUDING A STACK OF BUS-PRINTED DISKS AND A PLURALITY OF RADIALLY EXENDING PROCESSING UNIT BOARDS

[75] Inventor: Tokuhei Takashima, Tokyo, Japan

[73] Assignee: Graphico Co. Ltd., Tokyo, Japan

[ * ] Notice: The portion of the term of this patent subsequent to May 11, 2010 has been disclaimed.

[21] Appl. No.: 788,470

[22] Filed: Nov. 6, 1991

[30] Foreign Application Priority Data

Nov. 16, 1990 [JP] Japan .................................. 2-308848
Nov. 26, 1990 [JP] Japan .................................. 2-325038

[51] Int. Cl.⁵ .......................... G06F 15/20; H05K 7/00
[52] U.S. Cl. .................................... 395/800; 361/749; 361/775; 361/784
[58] Field of Search ............... 361/398, 384, 407, 409, 361/412, 393; 395/800

[56] References Cited

U.S. PATENT DOCUMENTS

| | | | |
|---|---|---|---|
| 4,331,956 | 5/1982 | Anderson | 340/825.89 |
| 4,734,825 | 3/1988 | Peterson | 361/414 |
| 4,908,576 | 3/1990 | Jackson | 371/22.3 |
| 4,985,830 | 1/1991 | Atac et al. | 364/200 |
| 5,060,111 | 10/1991 | Takashima | 361/384 |
| 5,091,822 | 2/1992 | Takashima | 361/384 |
| 5,189,665 | 2/1993 | Niehaus et al. | 3790/458 |
| 5,210,682 | 5/1993 | Takashima | 361/396 |

*Primary Examiner*—Parshotam S. Lall
*Assistant Examiner*—Zarni Maung

[57] ABSTRACT

Disclosed is a parallel processing system comprising, in combination, a stack assembly of bus-printed disks and a plurality of processing unit boards standing upright around and electrically connected to the stack assembly of bus-printed disks. Each bus-printed disk has an IC crossbar switch at its center and printed signal conductors radiating from the IC crossbar switch, and terminated with impedance matching elements. A selected processing unit board has an IC crossbar switch controller to allow the switch elements of each crossbar switch to open and close in a predetermined sequence. With this arrangement communication lines of equal, shortest possible length are provided to make a required electrical connection between selected processing units. Thus, reliable, noise-free, high-speed transportation of data is permitted.

4 Claims, 8 Drawing Sheets

PARALLEL PROCESSING SYSTEM INCLUDING A STACK OF BUS-PRINTED DISKS AND A PLURALITY OF RADIALLY EXENDING PROCESSING UNIT BOARDS

BACKGROUND OF THE INVENTION

1. Field of the Invention

The present invention relates to an improvement in or relating to a parallel processing system which permits the simultaneous operation of a plurality of processing units such as processors or memories, thereby attaining the high-speed processing of data, particularly color image data.

2. Description of the Prior Art

FIG. 11 shows a conventional parallel processing system comprising a plurality of processing units 1 to 6 connected to each other via buses. Also, FIG. 12 shows another conventional parallel processing system comprising a plurality of processing units 1 to 6 connected via a crossbar switch.

The perpetual connection type of parallel processing system as shown in FIG. 11 requires means to compensate for time difference in transporting data between different processing units due to different lengths of bus conductors between different processing units. Accordingly such parallel processing system is complicated, and the high-speed data transportation, and hence the high-speed data processing is hardly attainable.

As for the crossbar-switching type of parallel processing system as shown in FIG. 12 the number of the contacts of the crossbar switch will increase with the increase of the processing units to be handled. This will increase the size and cost of the whole system, and still disadvantageously data transportation distance will increase. As a matter of fact, the elongation of bus conductors is the cause for producing noise signals, and at the same time, making the data network sensitive to external noise signals.

SUMMARY OF THE INVENTION

In view of the above, one object of the present invention is to provide an improved parallel processing system which permits the high-speed data processing, guaranteed free of erroneous data transmission.

Another object of the present invention is to provide an improved parallel processing system which is small in size, and is less sensitive to external noise signals.

To attain these objects a parallel processing system according to the present invention comprises, in combination, a stack assembly of bus-printed disks whose centers are arranged on a common center axis, and a plurality of processing unit boards standing upright around and electrically connected to said stack assembly of bus-printed disks, each bus-printed disk comprising: a disk of dielectric material bearing on each of its opposite major surfaces, a printed radial pattern including a plurality of printed signal conductors of equal length radially extending from the center of said disk, each signal conductor on one major surface of said disk being connected to a corresponding signal conductor on the other major surface of said disk to make up a signal conductor pair; an integrated circuit crossbar switch placed on the center of said one major surface, the terminals of said crossbar switch being connected to said plurality of printed signal conductors on said one major surface; a plurality of impedance matching elements each connected to each signal conductor pair; and means to connect each of said impedance matching elements to a selected lead in a selected one of said processing unit boards, and at least one of said processing unit boards having means for controlling all the integrated circuit crossbar switches to allow the switch elements of each crossbar switch to open and close in a predetermined sequence.

With this arrangement the radial printed signal conductor pairs at equi-phase positions of all the disks make up parallel buses, and these parallel buses will be used as data lines, address lines, control lines etc. The contacts of the switching elements of every crossbar switch are controlled so as to open-and close in a predetermined sequence. Thus, the processing units such as processors, memories etc. can be selectively simultaneously connected via closed switching elements and associated transmission lines, thereby permitting selected processing units to send and receive data and effect data processing as required.

The radial signal conductors are of equal length, and therefore the transmission distance and hence transmission time is equal regardless of which processing units may be selected and connected. The terminating of each signal conductor with an impedance matching element has the effect of preventing the reflection of signals in the transmission line. Thus, a high-speed, reliable data transmission is permitted.

The stacking of radial signal conductor arrangements along a common center axis permits reduction of conductor length no matter how many processing units may be used in combination. Reduction of transmission lengths will prevent appearance of noise signals, and at the same time, will be insensitive to exterior noise signals, and still advantageously will lead to reduction of the size of the whole system.

BRIEF DESCRIPTION OF THE DRAWINGS

Other objects and advantages of the present invention will be understood from the following description of a parallel processing system according to one embodiment of the present invention, which is shown in accompanying drawings.

DETAILED DESCRIPTION OF THE INVENTION

Figure 1:
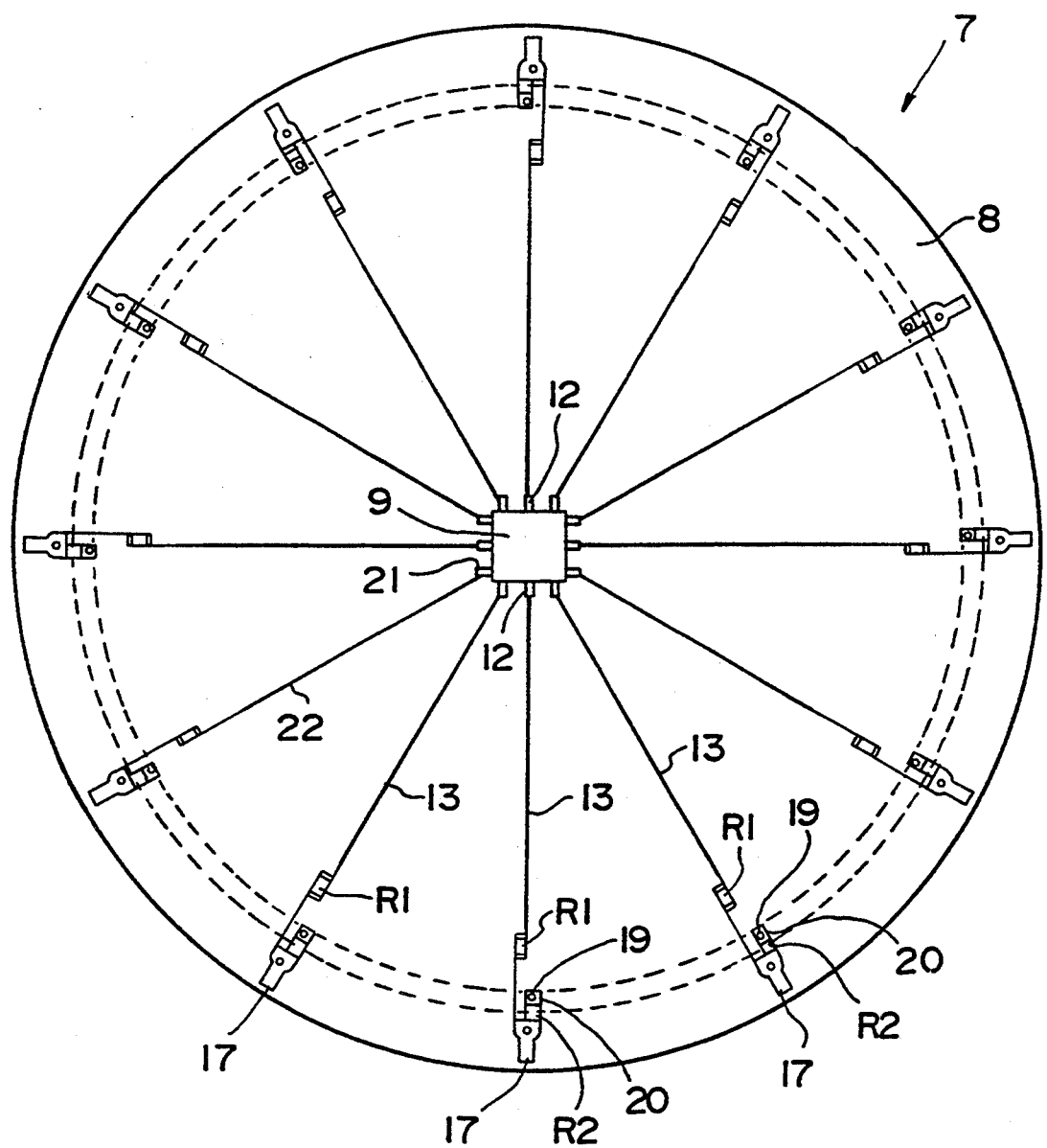
FIG. 1 is a plane view of a bus-printed disk, showing the front side thereof.
Figure 2:
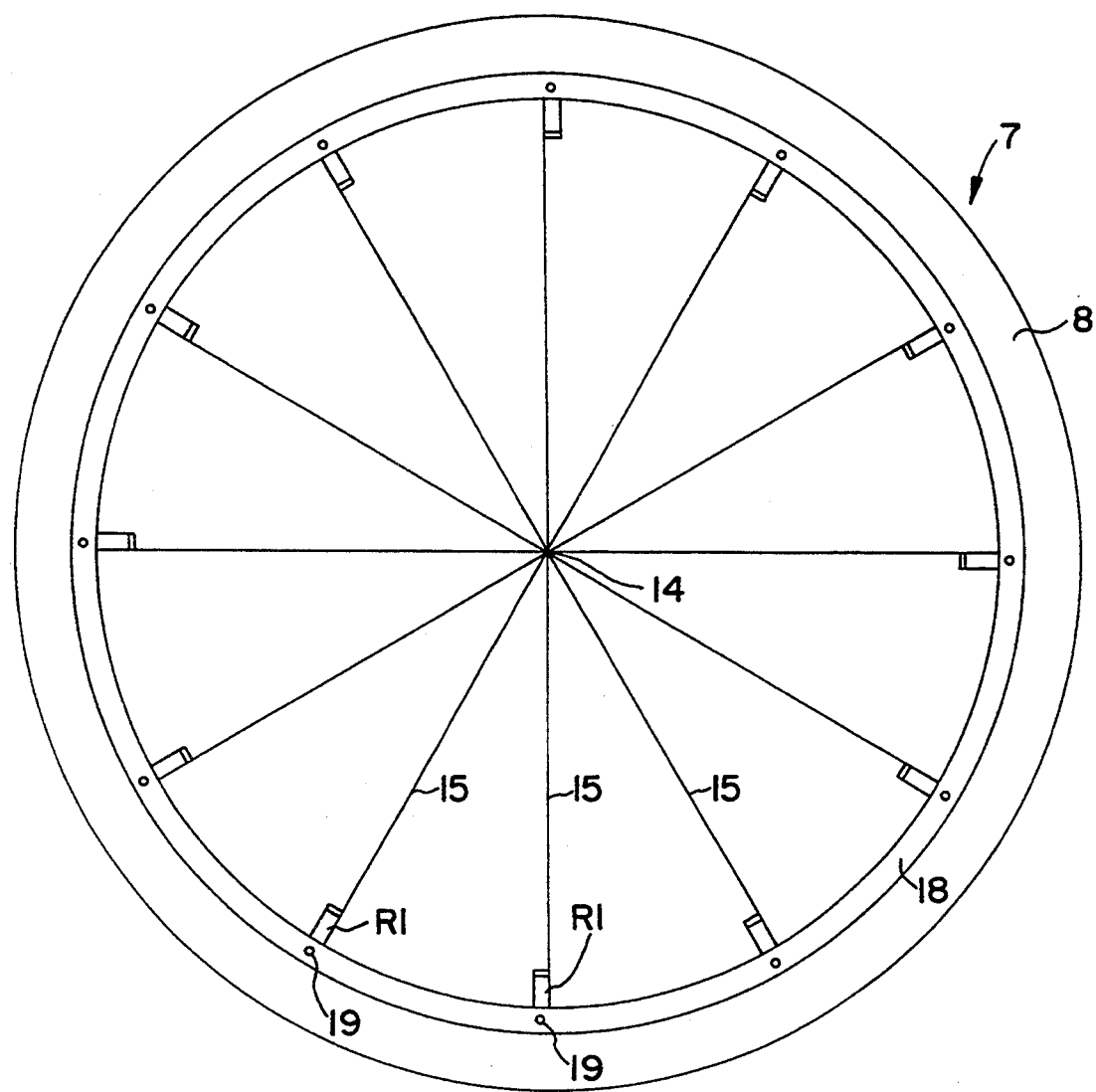
FIG. 2 is a similar view, but showing the rear side of the bus-printed disk.

Referring to FIGS. 1 and 2, a bus printed disk 7 comprises a disk of dielectric material 8 bearing on each of its opposite major surfaces, a printed radial pattern including a plurality of printed signal conductors 13 (FIG. 1) or 15 (FIG. 2) of equal length radially extending from the center of the disk, and an integrated circuit crossbar switch 9 placed on the center of one major surface of the disk 8.

Figure 5:
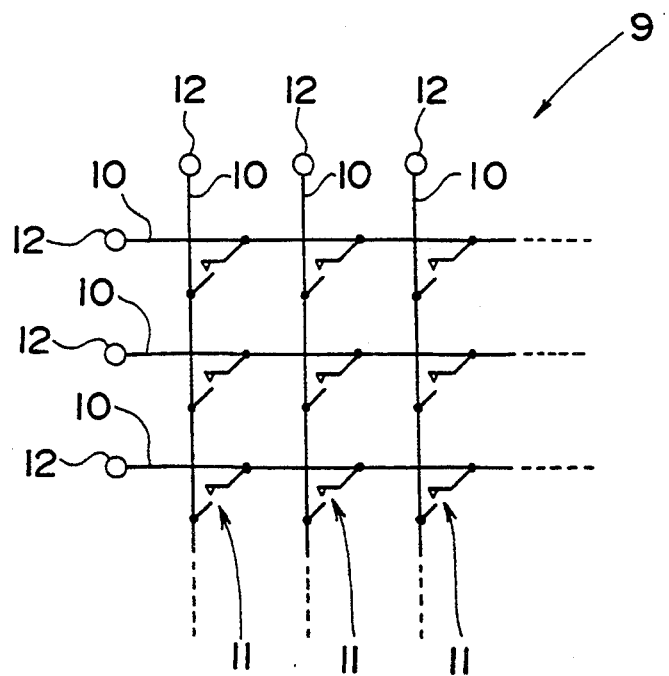
FIG. 5 shows an equivalent circuit of crossbar switch.

The crossbar switch 9 comprises a grid network having switching contacts 11 as shown in FIG. 5 at each crossing of signal conductors 10 and terminals 12 connected to signal conductors 10.

As seen from FIG. 1, the printed signal conductors 13 on the front surface of the disk 8 radially extend from the crossbar switch 9 at regular angular intervals with their inner ends connected to the terminals 12 of the crossbar switch 9.

Likewise, as seen from FIG. 2, the printed signal conductors 15 on the back surface of the disk 8 radially extend from the center 14 of the disk 8 at the same angular intervals as the front surface.

Figure 3:
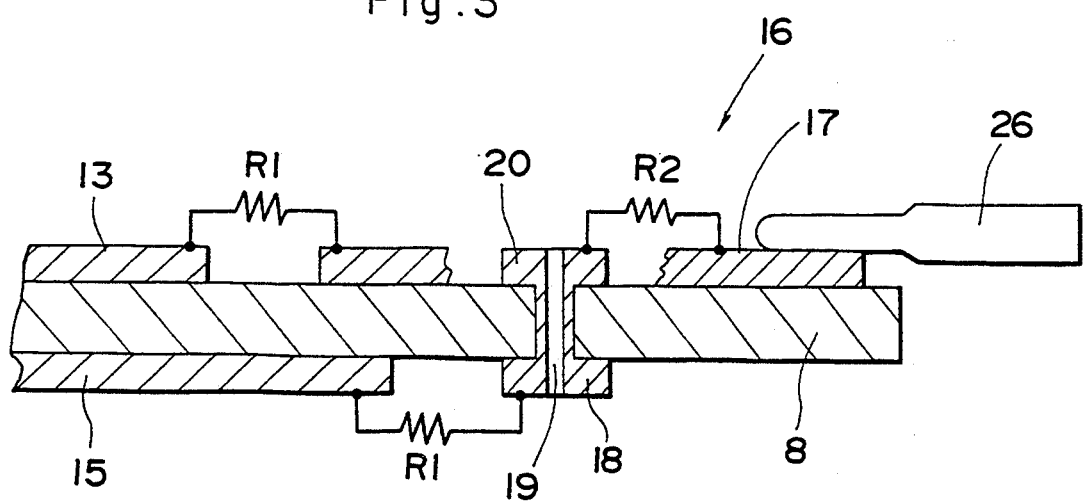
FIG. 3 shows, in section, the main part of an impedance matching circuit.

Each signal conductor 13 on the front surface is connected to a corresponding signal conductor 15 on the back surface to make up a signal conductor pair;

The outer or distal ends of the signal conductors 13 on the front surface of the disk 8 are connected to terminals 17, which are fixed to the circumference of the disk 8 at regular intervals, via the resistors R1 of the matching circuits 16 shown in FIG. 3. Preferably a printed resistor or chip resistor may be used as R1.

Likewise, the outer or distal ends of the signal conductors 15 on the back surface of the disk 8 are connected to annular ground conductor 18 via the resistors R1 of the matching circuits 16 as shown in FIG. 2.

Figure 4:
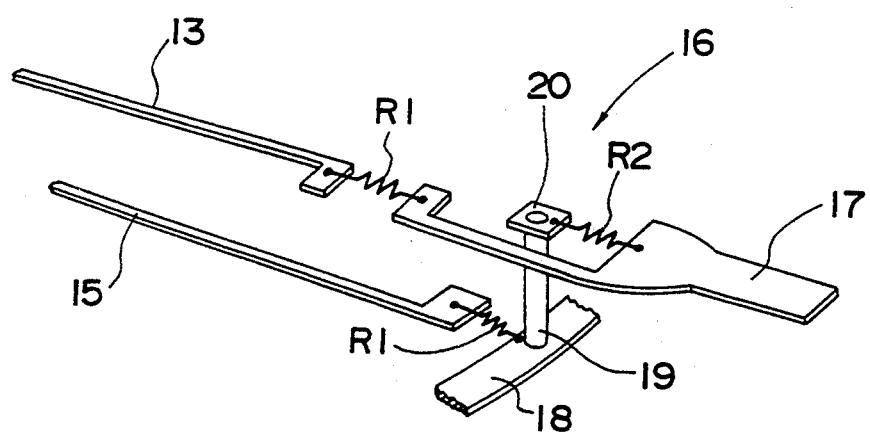
FIG. 4 is a perspective view of the impedance matching circuit, showing the connection between the resistors of the impedance matching circuit and two signal conductors.

The annular ground conductor 18 is connected to land pieces 20 on the front surface of the disk 8 through plated through hole couplers 19 which pass through the disks 8. Each land piece 20 is connected to an associated terminal via the resistor R2 of the impedance matching circuit 16, as seen from FIGS. 3 and 4. Preferably a printed resistor or chip resistor may be used as R2.

The crossbar switch 9 has a plurality of control terminals 21 other than the exterior terminals 12, and control conductors 22 are connected to these control terminals 21, although single control terminal and control conductor are shown in FIG. 1 only for the sake of simplicity in the drawing.

Figure 6:
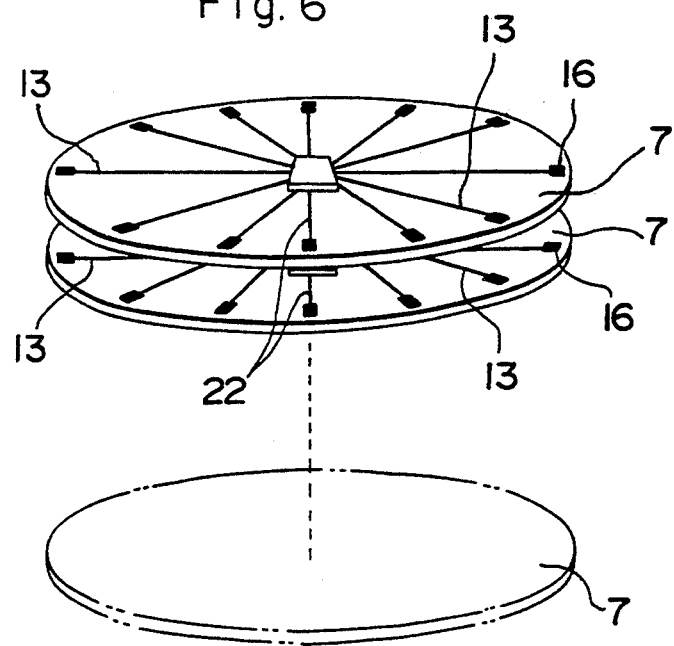
FIG. 6 is a perspective view of a stack of bus-printed disks.

As shown in FIG. 6, a plurality of bus printed disks 7 are arranged vertically at regular intervals along a common center axis with their signal conductor pairs 13, 15 and control conductors 22 vertically aligned in registration. Thus, each vertical alignment of radial signal conductor pairs 13, 15 in registration constitutes a parallel bus. The parallel buses thus constituted may be used as data lines, address lines, control lines etc.

Figure 7:
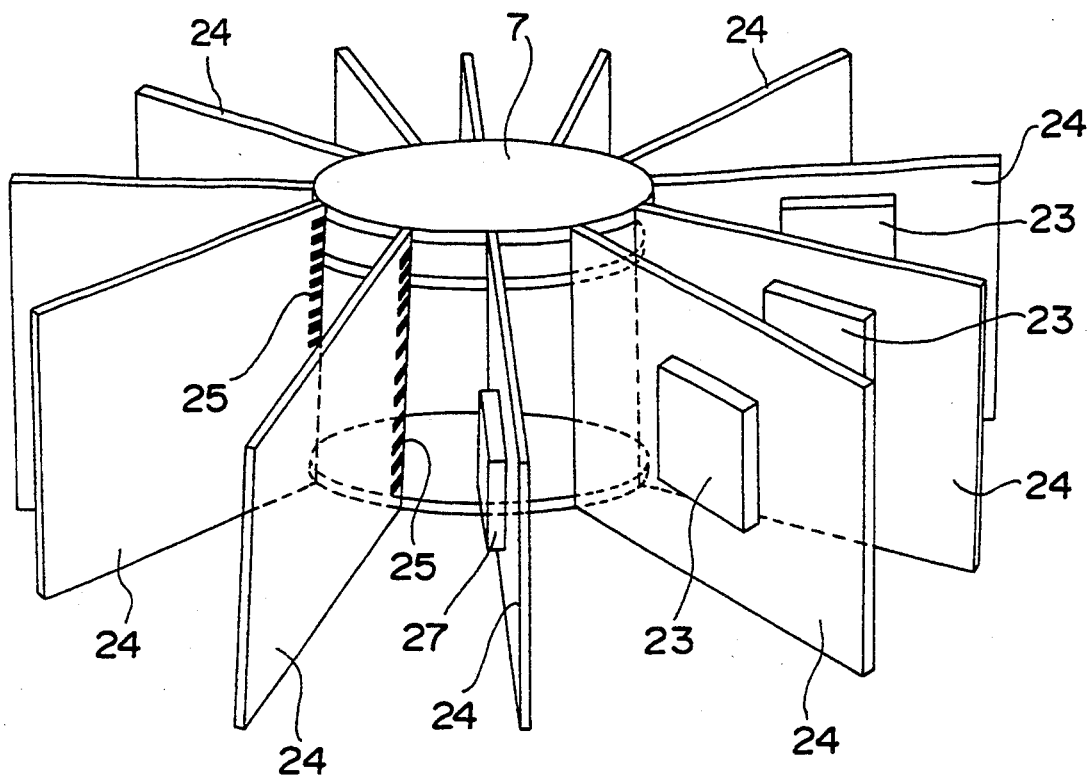
FIG. 7 is a perspective view of a parallel processing system according to the present invention.

Printed boards 24 each equipped with a processing unit 23 are arranged around the stack assembly of bus printed disks 7 in radial directions, as shown in FIG. 7. Exterior terminals 25 of each printed board 24 are electrically connected to the terminals 17 of the bus printed disks 7 via associated connectors (not shown). As shown in FIG. 3, each terminal 17 on the dielectric disk 8 has an outward opening tube receptacle 26, and each exterior terminal 25 on the bus printed boards 24 has a male plug (not shown) to insert in a corresponding receptacle 26.

At least one of the processing unit boards 24 has a crossbar switch controller 27 for controlling all the integrated circuit crossbar switches 9 to allow the switch elements 11 of each crossbar switch to open and close in a predetermined sequence, as described later.

Examples of the processing units 23 to be mounted to printed boards 24 are processors (abbreviated CPU), memories, input/output processors to control keyboards, displays etc.

Figure 8:
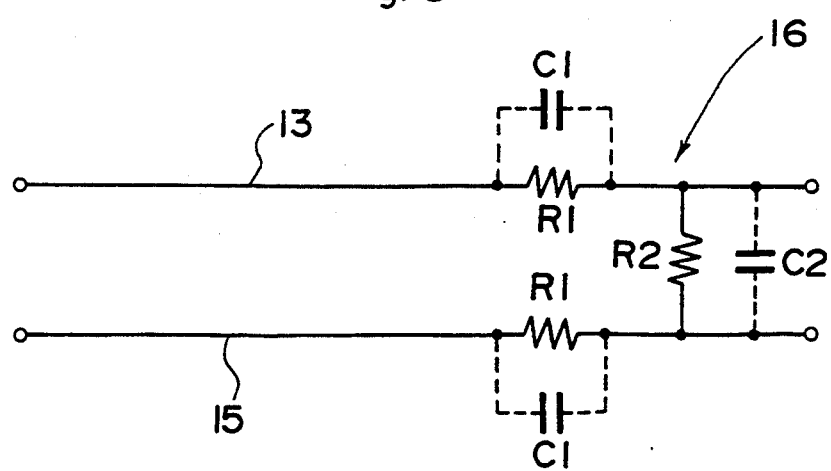
FIG. 8 is an equivalent circuit of a radial transmission line for high-frequency signals.

FIG. 8 shows an equivalent circuit of a single transmission line constituted by signal conductors 13 and 15 on a bus printed disk 7 for high frequency signals.

In the drawing C1 stands for a parasitic capacitor appearing across the resistor R1, and C2 stands for a parasitic capacitor appearing between signal conductors 13 and 15 on the opposite surfaces of the disk 7. These capacitances along with the resistors R1 and R2 make up an impedance matching circuit 16.

Now, a description is given as to how the resistors R1 and R2 can be determined.

Assume that "N" radial transmission lines each composed of a signal conductor pair I 3, I 5 are provided on disk 7. Each radial transmission line, which is equivalent to the circuit of FIG. 8, can be assumed to branch into "N-1" transmission lines each being equivalent to the circuit of FIG. 8.

The values of resistors R1 and R2 are then determined by a circuit designer skilled in the art in a well known manner based on the equivalent circuit shown in FIG. 8 so as to match the characteristic impedance of the transmission line and other circuit factors in order to prevent erroneous transmission of data between signal processing units 23.

Figure 9:
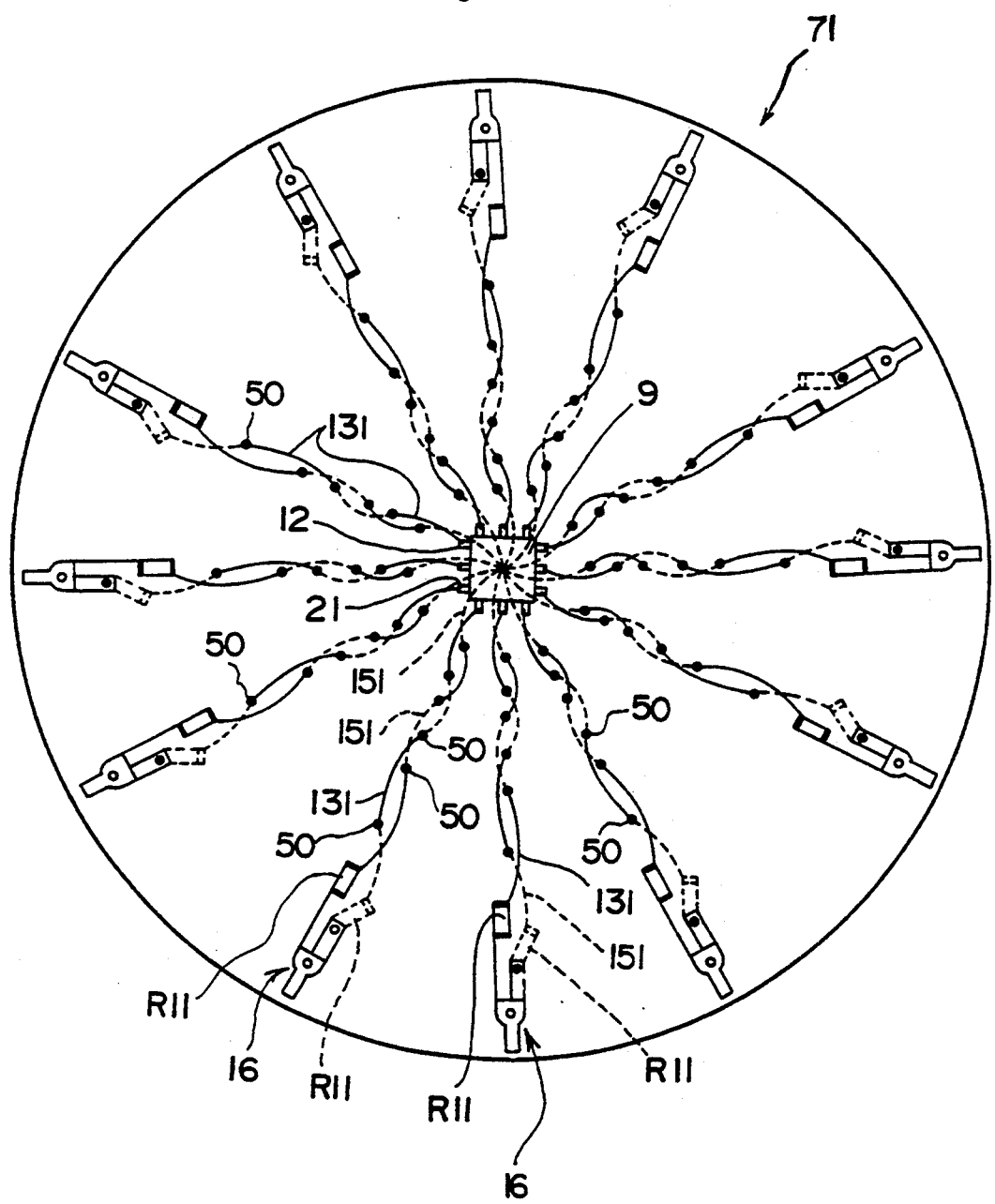
FIG. 9 is a plane view of another bus-printed disk, showing the front side thereof.

FIG. 9 shows another bus-printed disk 71 having twisted signal conductors 131 and 151 radiating from its center. A disk of dielectric material has a plurality of plated through holes 50 made at intervals along each radial line, and each signal conductor pair comprises two conductors 131 (front surface) and 151 (back surface) passing through every other hole 50 to alternately appear on front or back surface of the disk, thus making up twisted signal conductors of equal length.

Twisted signal conductors are terminated with the two resistors R11 which are parts of an impedance matching circuit 16.

The twisting of the signal conductors 13 and 15 on the opposite surfaces of the disk has the effect of reducing undesired electrostatic or magnetic inductions; making the transmission lines less sensitive to exterior noise signals; and preventing undesired electromagnetic radiation from the transmission lines.

Figure 10:
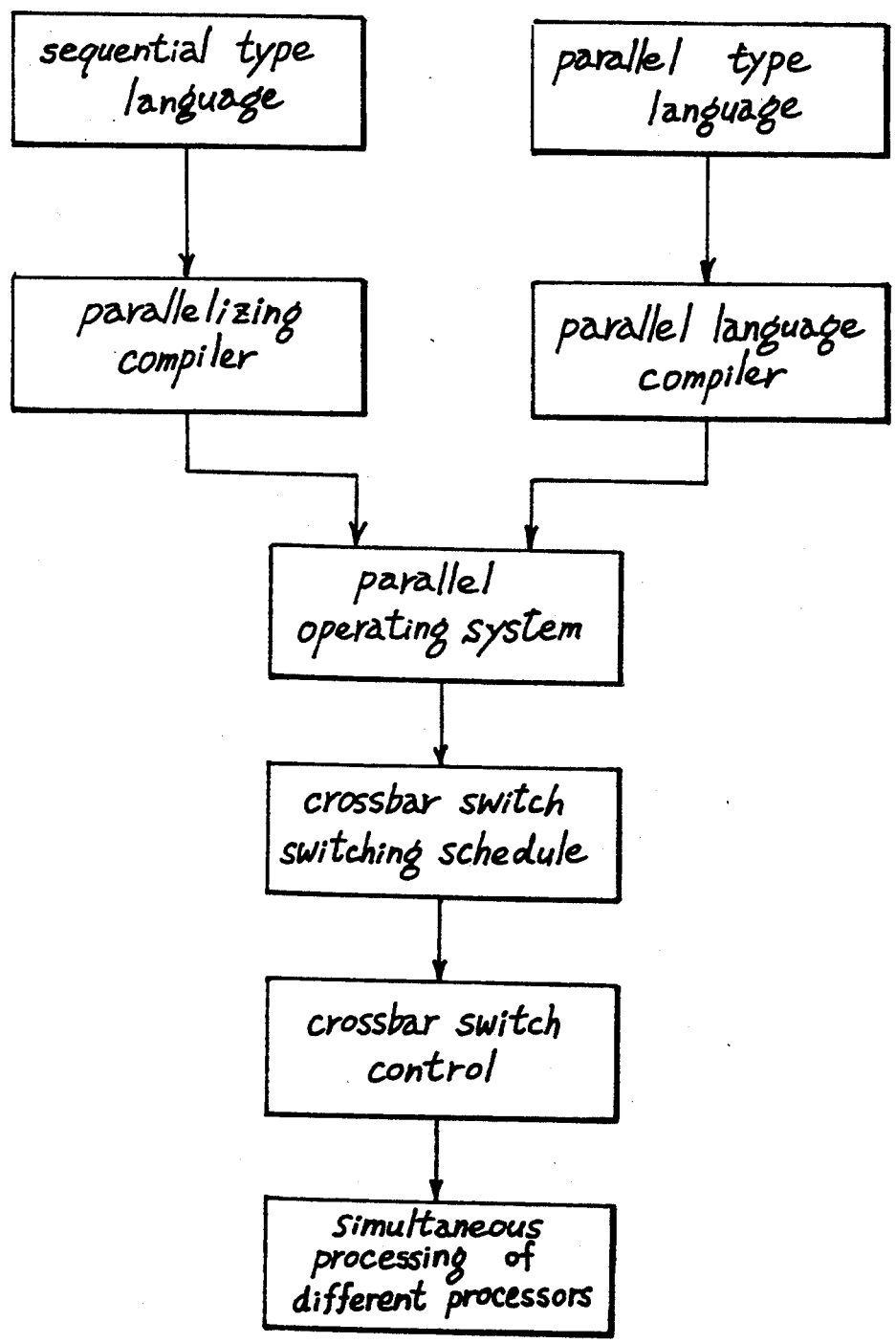
FIG. 10 is a flow chart describing the parallel processing carried out in a parallel processing system according to the present invention.
Figure 11:
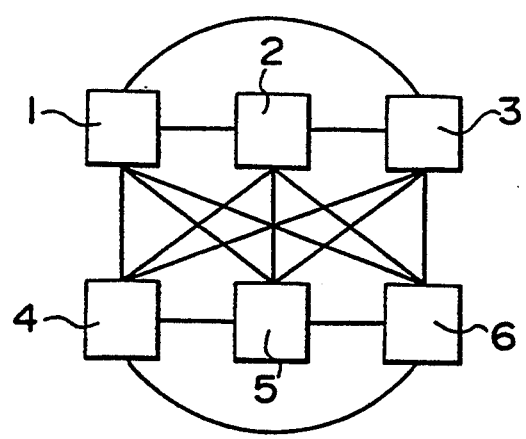
FIG. 11 shows schematically a conventional parallel processing system.
Figure 12:
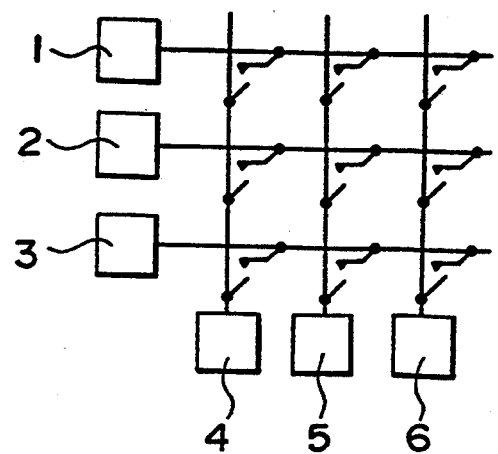
FIG. 12 shows schematically another conventional parallel processing system.

Referring to FIG. 10, the manner in which parallel processing is carried out in a parallel processing system according to the present invention, is described below.

Assume that a program according to which a given task such as color imaging processing is performed, is prepared in a sequential type language such as FORTRAN or in a parallel type language, and is stored in memories.

For the program expressed in the sequential type language, a parallelizing compiler will find out which parts of the program can be parallel-performed, and then it will rearrange such parts in parallel tasks. As for the program expressed in the parallel type language a parallel language compiler will selectively pick up parallel parts so that parallel machine codes may be prepared.

The operating system of parallel machine will carry out dynamic allotment of processors, and the switching controlling schedule of each crossbar switch will be prepared on the basis of the allotment of processors. In this way parallel-processing will be handled.

The crossbar switch controller 27 performs the switching of all crossing contacts 11 in each crossbar switch 9 according to a schedule, thereby permitting all processing units 23 to carry out simultaneously the processing of data.

Bus printed disks 7 are shown as having printed patterns on both sides. However, use may be made of a multi-layered disk having signal conductors printed on each layer. The use of such multi-layered disks makes it possible to substantially increase the density and compactness of elements in a parallel processing system, and accordingly reduce the size of the parallel processing system.

In the case where a parallel processing system according to the present invention is used in processing color-image data and outputting the processed data to a display device, red, green and blue data retrieved from different memories are further processed, and then the processed data are further transported to selected I/O CPUs by controlling the crossbar switch of the parallel-processing system, thus omitting transportation of data between memories.

In the case where a parallel processing system according to the present invention is used in processing color printing, selected CPUs of the parallel processing system are allotted to yellow, cyan, magenta and black to perform required processings simultaneously. When processing large amounts of data it is possible to store divisions of data in different sections of a selected memory, thereby permitting distribution of the CPUs' processing domain. In this case data transportation can be omitted, and accordingly quick processing results.

In the case where a parallel processing system according to the present invention is used in producing motion pictures such as animated cartoons, one CPU can be allotted to each frame to perform necessary processing, thereby permitting real time processing.

As may be understood from the above, a parallel processing system according to the present invention uses a pile of bus disks each having an integrated circuit crossbar switch at its center and a plurality of signal conductors radiating from the center crossbar switch, thus providing communication lines of equal, shortest possible length to make a required electrical connection between selected processing units, independent of the number of processing units 23 being used. Also, the terminating of each signal conductor with an impedance matching circuit permits suppression of reflection of signals at the end of signal conductor. Thus, reliable, noise-free, high-speed transportation of data is permitted.

What is claimed is:

1. A parallel processing system comprising, in combination, a stack assembly of bus-printed disks whose centers are arranged on a common center axis, and a plurality of processing unit boards standing upright around and electrically connected to said stack assembly of bus-printed disks, each bus-printed disk comprising:

a disk of dielectric material bearing on each of its opposite major surfaces, a printed radial pattern including a plurality of printed signal conductors of equal length radially extending from the center of said disk, each signal conductor on one major surface of said disk being connected to a corresponding signal conductor on the other major surface of said disk to make up a signal conductor pair; an integrated circuit crossbar switch placed on the center of said one major surface, the terminals of said crossbar switch being connected to said plurality of printed signal conductors on said one major surface; a plurality of impedance matching elements each connected to each signal conductor pair; and means for connecting said impedance matching elements to said processing unit boards, and at least one of said processing unit boards having means for controlling all the integrated circuit crossbar switches to allow the switch elements of each crossbar switch to open and close in a predetermined sequence.

2. A parallel processing system according to claim 1 wherein each said signal conductor comprises a substantially straight conductor, each said signal conductor on said one major surface of said disk being coupled to a corresponding signal conductor at the same angular or equiphase position on the other major surface to make up a signal conductor pair.

3. A parallel processing system according to claim 1 wherein each disk has a plurality of through holes made at intervals along each of radial lines; and said signal conductor pair comprises two conductors passing through every other hole to alternately appear on one or the other major surface of said disk, thus making up twisted pairs of signal conductors.

4. A parallel processing system according to claim 1 wherein each of said impedance matching elements includes a resistor and a distributed capacitance, said distributed capacitance comprising the capacitance between said signal conductor pair.

* * * * *